US011270875B2

(12) United States Patent
Kishida et al.

(10) Patent No.: US 11,270,875 B2
(45) Date of Patent: Mar. 8, 2022

(54) MASS SPECTROMETER

(71) Applicant: SHIMADZU CORPORATION, Kyoto (JP)

(72) Inventors: Takuro Kishida, Kyoto (JP); Yasushi Aoki, Kyoto (JP)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 17/259,399

(22) PCT Filed: Apr. 17, 2019

(86) PCT No.: PCT/JP2019/016507
§ 371 (c)(1),
(2) Date: Jan. 11, 2021

(87) PCT Pub. No.: WO2020/017121
PCT Pub. Date: Jan. 23, 2020

(65) Prior Publication Data
US 2021/0125817 A1 Apr. 29, 2021

(30) Foreign Application Priority Data

Jul. 20, 2018 (JP) .............................. JP2018-137153

(51) Int. Cl.
*H01J 49/02* (2006.01)
*H01J 49/40* (2006.01)
(Continued)

(52) U.S. Cl.
CPC .......... *H01J 49/022* (2013.01); *H01J 37/165* (2013.01); *H01J 49/0022* (2013.01);
(Continued)

(58) Field of Classification Search
CPC ........ H01J 49/022; H01J 49/025; H01J 49/40; H01J 49/0022; H01J 37/165; H01J 2209/264
(Continued)

(56) References Cited

U.S. PATENT DOCUMENTS

2012/0205534 A1\* 8/2012 Hunter ................ H01J 49/0013
250/282
2015/0200083 A1\* 7/2015 Brown .................... H01J 49/24
250/282
(Continued)

FOREIGN PATENT DOCUMENTS

JP 05-067893 A 3/1993
JP 2006-191742 A 7/2006
(Continued)

OTHER PUBLICATIONS

International Search Report of PCT/JP2019/016507 dated Jul. 9, 2019 [PCT/ISA/210].
(Continued)

*Primary Examiner* — Kiet T Nguyen
(74) *Attorney, Agent, or Firm* — Sughrue Mion, PLLC

(57) ABSTRACT

A power supply device includes a power supply circuit, a casing, a mold resin and a grounding member. The casing is conductive. At least part of a circuit portion of the power supply circuit is stored in the casing. A resin injector is formed in the casing. A mold resin is injected from the resin injector to fill the casing and enclose the circuit portion. The grounding member is conductive. The grounding member is arranged in the casing to shield the resin injector from the circuit portion while being in contact with the mold resin.

10 Claims, 8 Drawing Sheets

(51) Int. Cl.
    *H01J 49/00*     (2006.01)
    *H01J 37/16*     (2006.01)

(52) U.S. Cl.
    CPC ............ *H01J 49/025* (2013.01); *H01J 49/40* (2013.01); *H01J 2209/264* (2013.01)

(58) Field of Classification Search
    USPC ....................................... 250/281, 282, 287
    See application file for complete search history.

(56) References Cited

U.S. PATENT DOCUMENTS

| | | |
|---|---|---|
| 2019/0019664 A1 | 1/2019 | Furuhashi et al. |
| 2019/0088460 A1 | 3/2019 | Oshiro |
| 2019/0311893 A1 | 10/2019 | Aoki |
| 2020/0152441 A1 | 5/2020 | Furuhashi et al. |

FOREIGN PATENT DOCUMENTS

| | | |
|---|---|---|
| JP | 2013-030579 A | 2/2013 |
| JP | 2017-028796 A | 2/2017 |
| JP | 2017-045932 A | 3/2017 |
| WO | 2017/122339 A1 | 7/2017 |
| WO | 2017/145380 A1 | 8/2017 |
| WO | 2017/158842 A1 | 9/2017 |
| WO | 2018/066064 A1 | 4/2018 |

OTHER PUBLICATIONS

Written Opinion of PCT/JP2019/016507 dated Jul. 9, 2019 [PCT/ISA/237].

\* cited by examiner

MASS SPECTROMETER

CROSS REFERENCE TO RELATED APPLICATIONS

This application is a National Stage of International Application No. PCT/JP2019/016507 filed on Apr. 17, 2019, claiming priority based on Japanese Patent Application No. 2018-137153 filed on Jul. 20, 2018.

TECHNICAL FIELD

The present invention relates to a mass spectrometer that operate with high stability.

BACKGROUND ART

A power supply device that operates with high stability is used in a device that performs precise measurement or a precise analysis such as a measurement device or an analysis device. For example, in Patent Document 1, a time-of-flight mass spectrometer that has a flight tube is described. A high D/C voltage is supplied to the flight tube by a voltage applier (power supply device).

In the time-of-flight mass spectrometer, each ion generated from a sample is introduced into a flight space of the flight tube and flies in the flight space at a speed corresponding to a mass-to-charge ratio. Thereafter, the ions arrive at a detector in an ascending order of the mass-to-charge ratio and are detected by the detector. The flight time of each detected ion is converted into a mass-to-charge ratio, whereby a mass spectrum is created. Mass spectrometry of the sample is performed based on the created mass spectrum.

[Patent Document 1] WO 2017-158842

SUMMARY OF INVENTION

Technical Problem

In the time-of-flight mass spectrometer, the flight time of each ion changes depending on a voltage supplied to the flight tube. Therefore, in a case where stability of the power supply device that supplies a voltage to the flight tube is low, the flight time changes, and a mass spectrum cannot be created with high accuracy. Therefore, stability of operation of the power supply device is required to be more sufficiently improved.

An object of the present invention is to provide a power supply device and a mass spectrometer in which stability of operation is improved, and a method of manufacturing the power supply device.

Solution to Problem (1) A power supply device according to one aspect of the present invention includes a power supply circuit, a conductive casing that has a resin injector and stores at least part of a circuit portion of the power supply circuit, a mold resin that fills the casing to enclose the circuit portion and a conductive grounding member arranged in the casing to shield the resin injector from the circuit portion while being in contact with the mold resin.

In this power supply device, at least part of the circuit portion of the power supply circuit is stored in the conductive casing having the resin injector. The mold resin fills the casing to enclose the circuit portion. The conductive grounding member is arranged in the casing to shield the resin injector from the circuit portion while being in contact with the mold resin.

With this configuration, even in a case where an air gap is generated between a portion in the casing near the resin injector and the mold resin, an air gap is not generated between the grounding member and the circuit portion. Therefore, a single insulator made of a mold resin is formed, and a composite insulator is not formed, between the grounding member and the circuit portion. Thus, generation of very small discharge caused by a composite insulator is prevented. Thus, stability of operation of the power supply device can be improved.

(2) The grounding member may be provided to come into contact with an outer surface of the mold resin facing the resin injector of the casing. In this case, the grounding member can be easily arranged between the resin injector and the circuit portion.

(3) The grounding member may be embedded in the mold resin between the circuit portion and the resin injector of the casing. In this case, adhesion between the mold resin and the grounding member can be easily improved. Thus, generation of very small discharge caused by a composite insulator can be more easily prevented.

(4) The grounding member may include a same resin as the mold resin. In this case, adhesion between the mold resin and the grounding member is improved. Further, a difference in thermal expansion between the mold resin and the grounding member is minimized. Thus, separation of the grounding member from the mold resin caused by thermal expansion can be easily prevented.

(5) The mold resin may include a silicone resin, and the grounding member may be formed of a conductive silicone resin. In this case, the mold resin and the grounding member can be easily formed.

(6) The casing may include first and second main surface portions facing each other, and first, second, third and fourth side surface portions connecting the first and second main surface portions to each other, the first and second side surface portions may face each other, the third and fourth side surface portions may face each other, the first main surface portion may be provided to come into contact with the resin injector, and a distance between the first main surface portion and the second main surface portion may be shorter than a distance between the first side surface portion and the second side surface portion and may be shorter than a distance between the third surface portion and the fourth surface portion.

In this case, it is possible to easily fill the casing with the mold resin without generating an air gap between the second main surface portion and the first to fourth side surface portions. Further, even in a case where an air gap is generated between the first main surface portion and the mold resin, an air gap is not generated between the grounding member and the circuit portion. Thus, generation of very small discharge caused by a composite insulator can be prevented, and stability of operation of the power supply device can be improved.

(7) The power supply device may further include a temperature detector that detects a temperature of the casing, and a temperature adjustor that adjusts the temperature of the casing based on the temperature detected by the temperature detector. In this case, a change in temperature of the surroundings of the circuit portion in the casing is prevented. Thus, stability of operation of the power supply device can be more sufficiently improved.

(8) The power supply device may further include a heat dissipation member that dissipates heat generated from the temperature adjustor. In this case, the temperature of the casing can be adjusted sufficiently.

(9) The power supply device may further include a thermal insulating member that is attached to an outer surface of the casing while the heat dissipation member is exposed. In this case, a change in temperature of the casing caused by a change in outside temperature is prevented more reliably. Thus, stability of operation of the power supply device can be improved more sufficiently.

(10) A mass spectrometer according to another aspect of the present invention includes an ionizer that ionizes a sample, a fly portion into which ions generated by the ionizer are introduced and in which the ions fly, an ion detector that detects the ions that have flown in the fly portion and the power supply device according to the one aspect of the present invention in which the fly portion is constituted by at least one electrode and which supplies a voltage to the electrode.

The mass spectrometer includes a Time-Of-Flight Mass Spectrometer (TOFMS) that performs mass spectrometry based on a fly time of each ion that flies in a fly portion or a Fourier Transform Mass Spectrometer (FTMS) that performs mass spectrometry by measuring a fly period of each ion that flies in a fly portion, for example. The ions generated from the sample by the ionizer are introduced into the fly portion and the ions that have flown in the fly portion are detected by the ion detector. A voltage is supplied to an electrode of the fly portion by the above-mentioned power supply device. In this case, stability of operation is improved in the power supply device, so that mass spectrometry can be performed with high accuracy.

(11) The fly portion may be a flight tube. In this case, the mass spectrometer is a TOFMS, and the ions that have flown in the flight tube are detected by the ion detector. Mass spectrometry is performed based on the flight time of each ion detected by the ion detector. A voltage is supplied to the flight tube by the above-mentioned power supply device. In this case, stability of operation is improved in the power supply device, so that mass spectrometry can be performed with high accuracy.

(12) A method of manufacturing a power supply device according to yet another aspect of the present invention includes the steps of preparing a conductive casing that stores at least part of a circuit portion of a power supply circuit, filling the casing with a mold resin to enclose the circuit portion by injecting a resin precursor from a resin injector of the casing and arranging a conductive grounding member in the casing to shield the resin injector from the circuit portion while being in contact with the mold resin.

With the method of manufacturing the power supply device, at least part of the circuit portion of the power supply circuit is stored in the conductive casing. The resin precursor is injected from the resin injector, whereby the mold resin fills the casing to enclose the circuit portion. The conductive grounding member is arranged in the casing to shield the resin injector from the circuit portion while being in contact with the mold resin. In the manufactured power supply device, generation of very small discharge caused by a composite insulator is prevented. Thus, stability of operation of the power supply device can be improved.

Advantageous Effects of Invention

The present invention enables improvement of stability of operation of the power supply device.

DESCRIPTION OF EMBODIMENTS (1) Configuration of Mass Spectrometer

Figure 1:
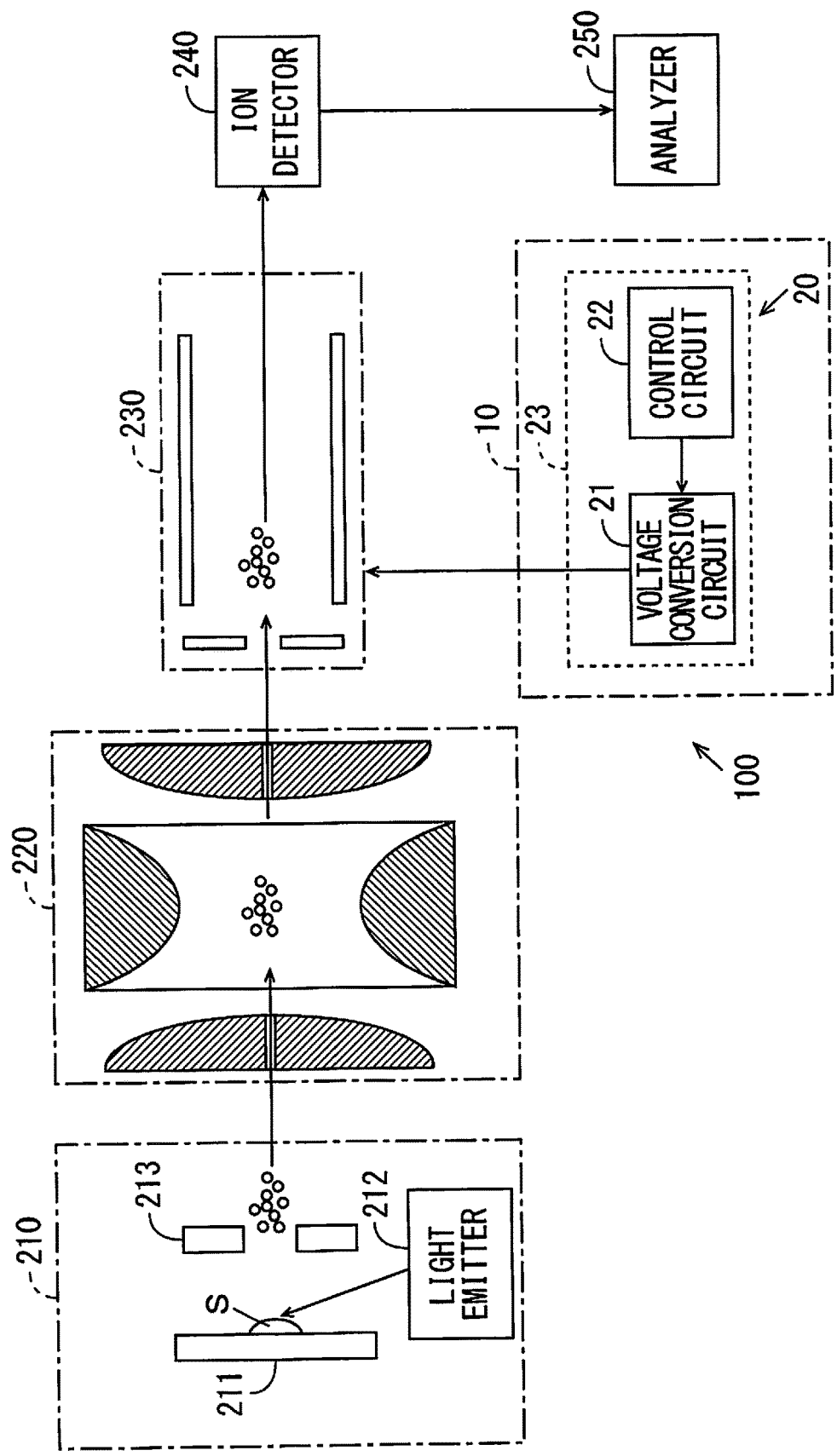
FIG. 1 is a diagram showing the configuration of a mass spectrometer according to one embodiment of the present invention.

A power supply device, a mass spectrometer including the power supply device and a method of manufacturing the power supply device according to embodiments of the present invention will be described below in detail with reference to the drawings. FIG. 1 is a diagram showing the configuration of the mass spectrometer according to one embodiment of the present invention. The mass spectrometer 200 is an ion trap mass spectrometer using a MALDI (Matrix-Assisted Laser Desorption Ionization) technique and an ion source, and includes a power supply device 100, an ionizer 210, an ion trap 220, a flight tube 230, an ion detector 240 and an analyzer 250 as shown in FIG. 1.

The power supply device 100 includes a casing 10 and a power supply circuit 20. The casing 10 is formed of a conductive material. The conductive material is aluminum, for example. The conductive material may be another material such as copper and preferably has high electrical conductivity and high thermal conductivity. The casing 10 is maintained at a ground potential and stores the power supply circuit 20.

The power supply circuit 20 includes a voltage conversion circuit 21 and a control circuit 22. In the present embodiment, the voltage conversion circuit 21 and the control circuit 22 are mounted on a common circuit board 23. The voltage conversion circuit 21 and the control circuit 22 may be mounted on separate circuit boards. In this case, as long as the circuit board on which the control circuit 22 is mounted is stored in the casing 10 as a circuit portion of the power supply circuit 20, the circuit board on which the voltage conversion circuit 21 is mounted does not have to be stored in the casing 10. The circuit board on which the voltage conversion circuit 21 is mounted may be stored in a casing different from the casing 10.

The voltage conversion circuit 21 converts an AC voltage supplied from an external power supply such as a commercial power supply into a DC voltage of 10 kV, for example, and supplies the DC voltage to the flight tube 230. Specifically, the voltage conversion circuit 21 includes a plurality of circuit elements for generating voltages of 2.5 kV, 5 kV, 7.5 kV and 10 kV in steps. The control circuit 22 controls the operation of the voltage conversion circuit 21. Details of the power supply device 100 will be described below.

The ionizer 210 includes a sample plate 211, a light emitter 212 and an extraction electrode 213. The sample plate 211 supports a sample S mixed with a matrix. The light emitter 212 irradiates the sample S on the sample plate 211 with pulse-form ultraviolet light. Thus, various components included in the sample S are ionized. The extraction electrode 213 forms a predetermined electric field, thereby extracting the generated ions toward the ion trap 220.

The ion trap 220 captures the ions extracted from the ionizer 210 by forming a quadrupole field and cools the ions by injecting a cooling gas to the captured ions. The cooling gas is a helium gas or an argon gas, for example. Further, the ion trap 220 ejects the ions by adding a predetermined electric field to the cooled ions. The ions ejected from the ion trap 220 are introduced into the flight tube 230.

Each ion that has been introduced into the flight tube 230 flies in and passes through a flight space in the flight tube 230 at a speed corresponding to a mass-to-charge ratio, and arrives at the ion detector 240 in an ascending order of the mass-to-charge ratio. The ion detector 240 is a secondary electron multiplier tube, for example. The ion detector 240 detects the ions that have passed through the flight tube 230.

The analyzer 250 is implemented by a CPU (Central Processing Unit), for example, and converts a flight time of the each ion detected by the ion detector 240 into a mass-to-charge ratio using the following formula (1), thereby creating a mass spectrum. Here, t is a flight time, L is a flight distance, $N_A$ is an Avogadro's number, e is an elementary electric charge, V is a voltage supplied by the power supply device 100 to the flight tube 230 and m/z is a mass-to-charge ratio.

[Formula 1]

$$t = \sqrt{\left(\frac{2L^2}{N_A eV}\right)\frac{m}{z}} \quad (1)$$

As shown in the formula (1), the flight time t of each ion changes depending on a voltage V supplied to the flight tube 230. Therefore, in a case where stability of a voltage supplied to the flight tube 230 is low, the flight time t changes, and a mass spectrum cannot be created with high accuracy. As such, the power supply device 100 is required to supply a voltage to the flight tube 230 with extremely high stability. Details of the power supply device 100 will be described below.

(2) Configuration of Power Supply Device

Figure 2:
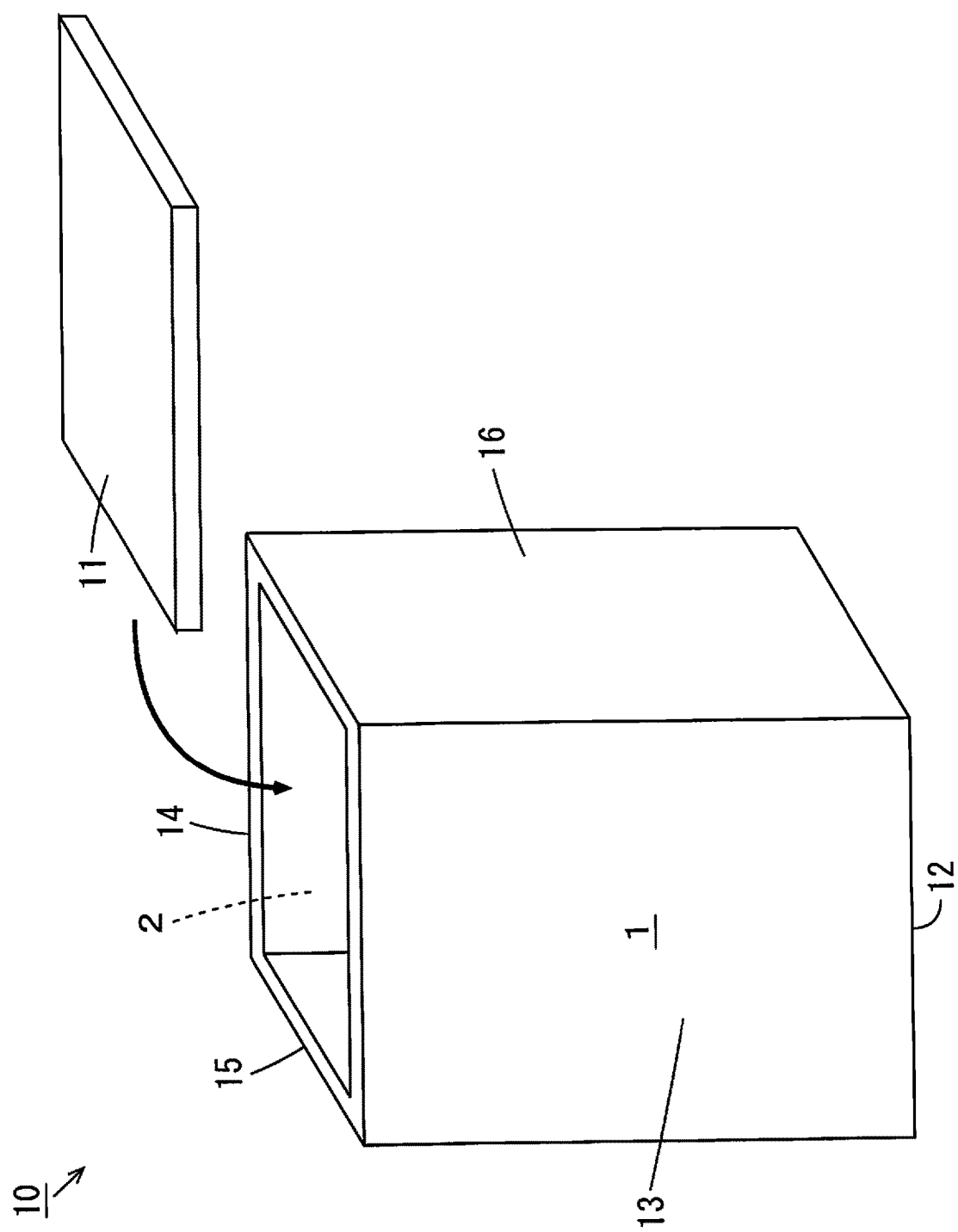
FIG. 2 is a perspective view showing a casing of a power supply device of FIG. 1.

FIG. 2 is a perspective view showing the casing 10 of the power supply device 100 of FIG. 1. As shown in FIG. 2, the casing 10 includes an upper surface portion 11, a bottom surface portion 12 and four side surface portions 13, 14, 15, 16. The upper surface portion 11 and the bottom surface portion 12 are examples of first and second main surface portions. The side surface portions 13 to 16 are examples of first to fourth side surface portions, respectively.

A casing main body 1 having an opening in its upper portion is constituted by the bottom surface portion 12 and the four side surface portions 13 to 16. The opening in the upper portion of the casing main body 1 is used as a resin injector 2, described below. The upper surface portion 11 is a lid of the casing main body 1 and attached to the upper portion of the casing main body 1 as indicated by the thick arrow in FIG. 2. Thus, the resin injector 2 is closed, and the casing 10 having a cuboid shape is constituted. The casing 10 may have a shape other than a cuboid shape. For example, the casing 10 may have another shape such as a cylindrical shape or a polygonal shape.

As described above, the power supply circuit 20 of FIG. 1 is stored in the casing 10. In the present embodiment, the thickness of the upper surface portion 11, the bottom surface portion and the four side surface portions 13 to 16 are relatively large and is from 7 mm to 8 mm, for example. In this case, the environment inside of the casing 10 is segregated from the outside environment. Thus, the power supply circuit 20 in the casing 10 is prevented from being electrically charged. Further, a noise is prevented from being mixed in the power supply circuit 20.

Figure 3:
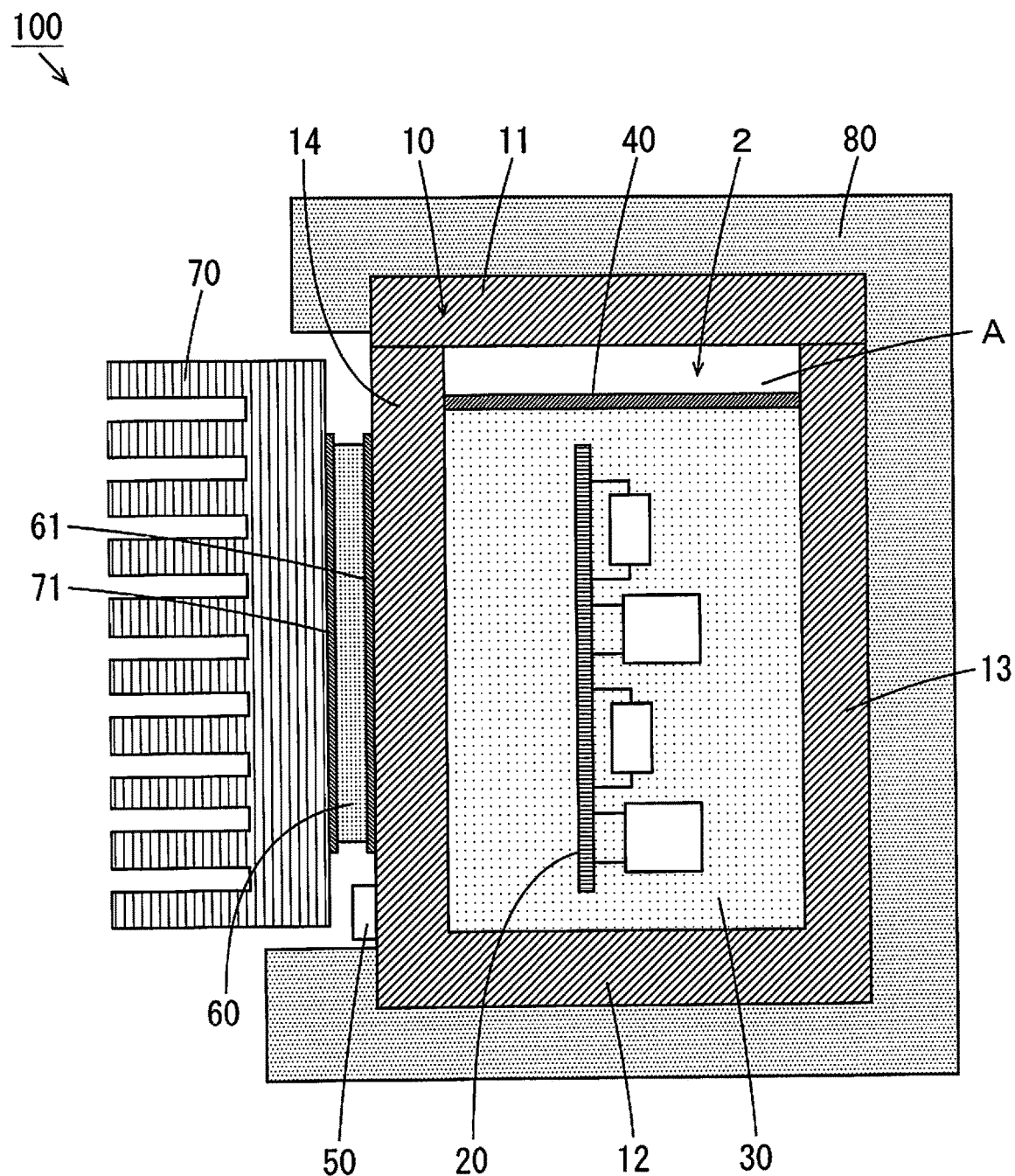
FIG. 3 is a schematic cross sectional view showing the configuration of the power supply device of FIG. 1.

FIG. 3 is a schematic cross sectional view showing the configuration of the power supply device 100 of FIG. 1. As shown in FIG. 3, the power supply device 100 includes a mold resin 30, a grounding member 40, a temperature detector 50, a temperature adjustor 60, a heat dissipation member 70 and a thermal insulating member 80 in addition to the casing 10 and the power supply circuit 20. The mold resin 30 fills the casing 10 to enclose the power supply circuit 20. Thus, the power supply circuit 20 is insulated from the casing 10.

Here, the mold resin 30 preferably adheres to all of the six surfaces of the casing 10. However, it is difficult to make the mold resin 30 adhere to all of the six surfaces at all times because of cure shrinkage of the mold resin 30 or a difference in thermal expansion between the mold resin 30 and the casing 10. Therefore, the mold resin 30 might not adhere to at least one surface of the casing 10.

In the present embodiment, a resin precursor is injected from the resin injector 2, whereby the casing main body 1 is filled with the mold resin 30 as described below. The mold resin 30 directly adheres to the bottom surface portion 12 and the four side surface portions 13 to 16. However, the mold resin 30 might not adhere to the upper surface portion 11 that comes into contact with the resin injector 2. In this case, a small air gap A is generated between the upper surface portion 11 and the mold resin 30. In FIG. 3, the air gap A is enlarged in a diagram in order to facilitate viewing. The same is true for the subsequent diagrams.

In a case where the air gap A is generated in the casing 10, a composite insulator made of a portion of the mold resin 30 and the air gap A is formed between the power supply circuit 20 and the upper surface portion 11. Thus, an electric field concentrates because of a difference in dielectric constant between the mold resin 30 and the air gap A, and very small discharge is generated in the air gap A. Even being very small, such discharge might be a problem in a case where a voltage is supplied to the flight tube 230 of FIG. 1 with high stability.

As such, the conductive grounding member 40 maintained at a ground potential is provided on the outer surface of the mold resin 30 facing the upper surface portion 11 (the resin injector 2). Thus, the power supply circuit 20 enclosed by the mold resin 30 is shielded from the upper surface portion 11 by the grounding member 40.

The temperature detector 50 is a thermistor, for example, and is attached to the outer surface of the casing 10 (the side surface portion 14 in the example of FIG. 3) to detect the temperature of the casing 10. The plurality of temperature detectors 50 may be provided and attached to a plurality of portions of the casing 10 to detect the temperatures of the plurality of portions of the casing 10. Further, the temperature detector 50 may be attached to a portion inside of the casing 10 to detect the temperature inside of the casing 10.

The temperature adjustor 60 is a peltier element, for example, and is attached to the outer surface of the casing 10 (the side surface portion 14 in the example of FIG. 3) to adjust the temperature of the casing 10 based on the temperature detected by the temperature detector 50. The heat dissipation member 70 is a heat sink, for example, and is attached to the temperature adjustor 60 to dissipate heat generated from the temperature adjustor 60. A thermal conductor 61 such as a thermal conductive sheet or grease is provided between the casing 10 and the temperature adjustor 60. Similarly, a thermal conductor 71 is provided between the temperature adjustor 60 and the heat dissipation member 70.

The thermal insulating member 80 is resin such as styrofoam or polyurethane, and is attached to the outer surface of the casing 10 such that the heat dissipation member 70 is exposed. In this case, a change in temperature of the casing 10 caused by a change in outside temperature is prevented. Thus, a change in temperature of the surroundings of the power supply circuit 20 in the casing 10 can be prevented.

(3) Steps of Manufacturing Power Supply Device

Figure 4A:
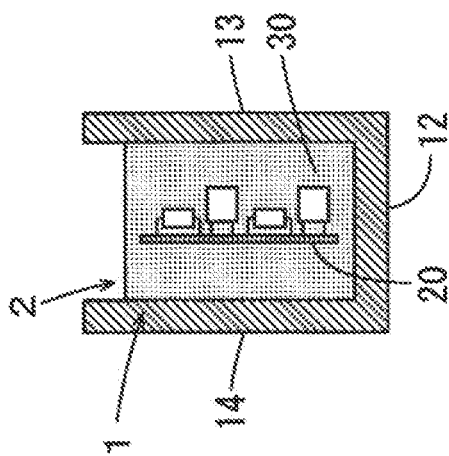
FIGS. 4A to 4D are diagrams showing the steps of manufacturing the power supply device.
Figure 4C:
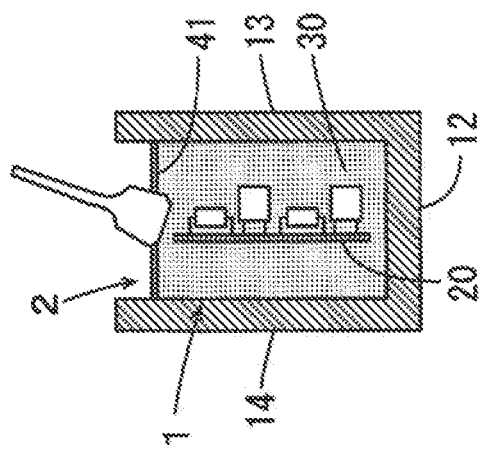
Figure 4B:
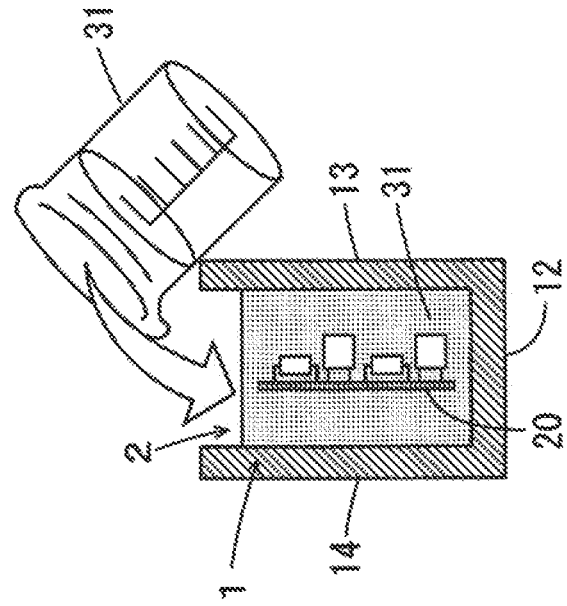

FIGS. 4A to 4D and 5A to 5C are diagrams showing the steps of manufacturing the power supply device 100. As shown in FIG. 4A, the power supply circuit 20 is stored in the casing main body 1. Next, as shown in FIG. 4B, a liquid resin precursor 31 for forming the mold resin 30 is injected into the casing main body 1 from the resin injector 2. The precursor 31 is defoamed in a vacuum and cured by being heated, and the mold resin 30 is formed in the casing main body 1 as shown in FIG. 4C.

The precursor 31 slightly shrinks when the mold resin 30 is formed. Even in this case, in the present embodiment, the precursor 31 is injected from the resin injector 2 in the upper portion of the casing main body 1, so that adhesion between the mold resin 30, and the bottom surface portion 12 and the four side surface portions 13 to 16 is maintained.

Figure 4D:
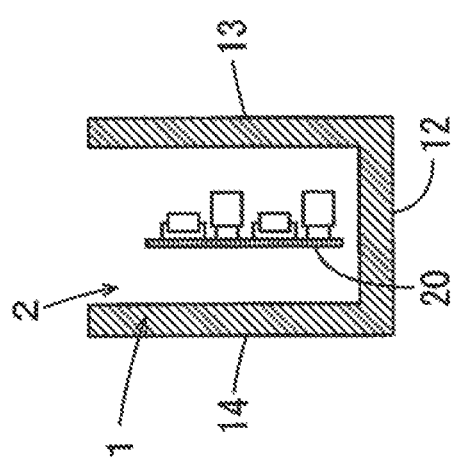

Subsequently, as shown in FIG. 4D, a liquid resin precursor 41 for forming the grounding member 40 is applied to the outer surface (the upper surface in the present example) of the mold resin 30. The precursor 41 may be applied to the outer surface of the precursor 31 before the precursor 31 is cured completely. Further, the precursor 41 may be applied to the outer surface of the mold resin 30 by a brush or may be poured onto the outer surface of the mold resin 30. Thereafter, the precursor 41 is cured, so that the grounding member 40 is formed on the outer surface of the mold resin 30 as shown in FIG. 5A.

The grounding member 40 preferably includes the same resin as the mold resin 30. In the present embodiment, the mold resin 30 includes a silicone resin, and the grounding member 40 is formed of a conductive silicone resin. In this case, adhesion between the mold resin 30 and the grounding member 40 is improved. Further, a difference in thermal expansion between the mold resin 30 and the grounding member 40 is minimized. Thus, separation of the grounding member 40 from the mold resin 30 caused by thermal expansion can be easily prevented.

Meanwhile, although the grounding member 40 is formed because of curing of the liquid precursor 41 in the abovementioned example, the present invention is not limited to this. The grounding member 40 may be manufactured with use of another material or another method. For example, the grounding member 40 may be a conductive plate, and may be attached to the outer surface of the mold resin 30 by being pressed against the outer surface of the mold resin 30.

Figure 5C:
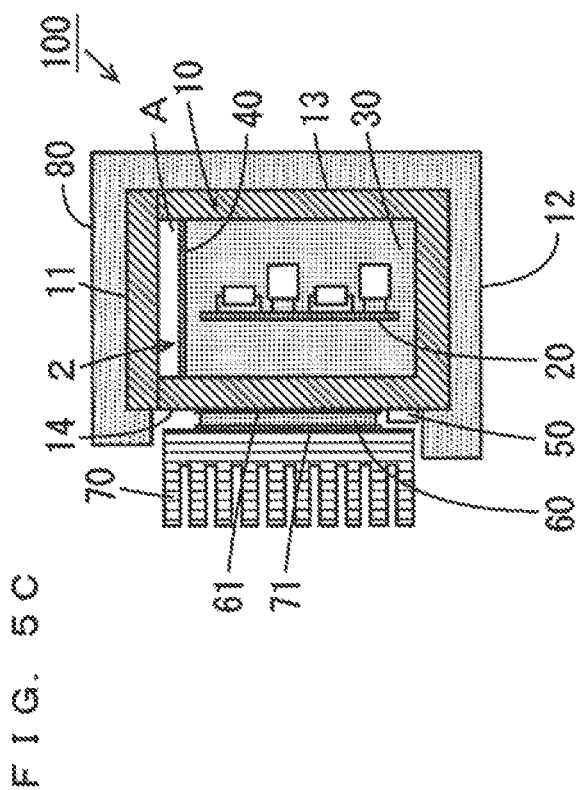
FIGS. 5A to 5C are diagrams showing the steps of manufacturing the power supply device.
Figure 5A:
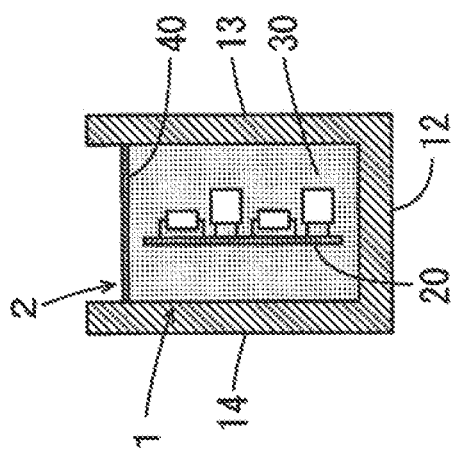
Figure 5B:
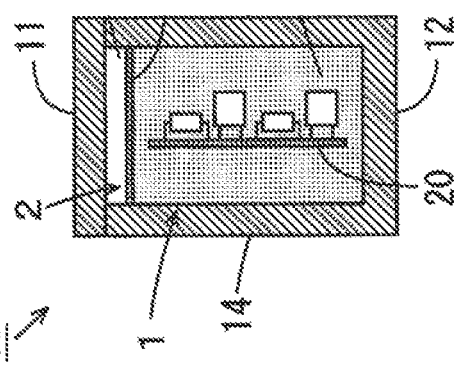

Next, as shown in FIG. 5B, the upper surface portion 11 is attached to the upper portion of the casing main body 1 to close the resin injector 2. The upper surface portion 11 may be fixed to the casing main body 1 by a fixing member such as a bolt (not shown). Thus, the casing 10 having a cuboid shape is constituted. Part of the grounding member 40 electrically comes into contact with the casing 10. Therefore, the casing 10 is maintained at a ground potential, so that the grounding member 40 is maintained at a ground potential.

Thereafter, as shown in FIG. 5C, the temperature detector 50 is attached to the casing 10, and the temperature adjustor 60 is attached to the casing 10 through the thermal conductor 61. Further, the heat dissipation member 70 is attached to the temperature adjustor 60 through the thermal conductor 71. Further, the thermal insulating member 80 is attached to the outer surface of the casing 10 such that the heat dissipation member 70 is exposed. Thus, the power supply device 100 is completed.

With the above-mentioned manufacturing steps, the mold resin 30 directly comes into contact with the bottom surface portion 12 and the four side surface portions 13 to 16 without the grounding member 40. Therefore, as compared to a case where the mold resin 30 comes into contact with all of the six surfaces of the casing 10 through a conductive film, a metal plate or another thermal conductive member, thermal conductivity between the mold resin 30 and the casing 10 is improved. Thus, the temperature of the surroundings of the power supply circuit 20 can be more stably controlled.

(4) Modified Examples

Figure 6:
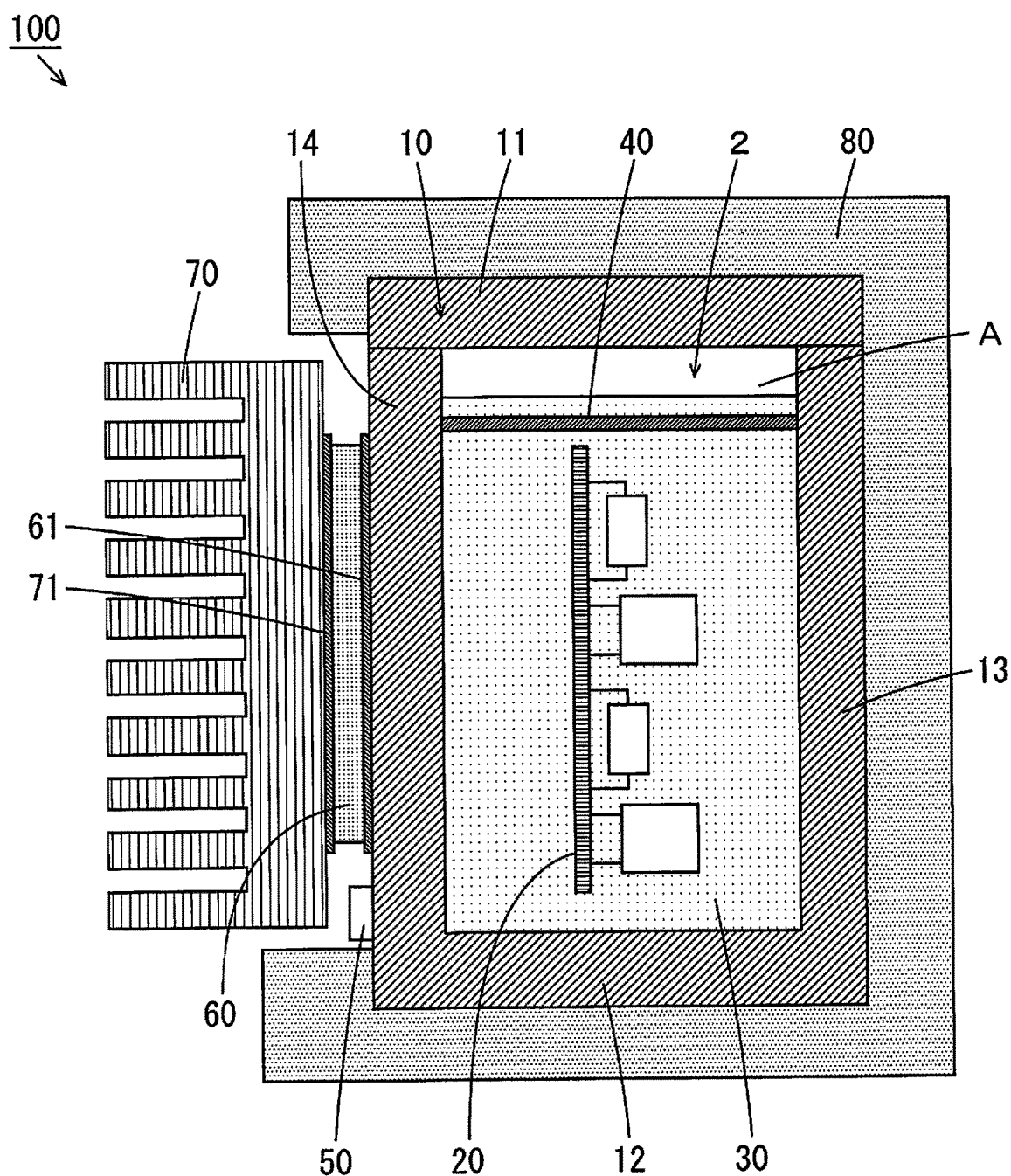
FIG. 6 is a schematic cross sectional view showing the configuration of the power supply device according to a first modified example.

While the grounding member 40 is provided on the outer surface of the mold resin 30 in the present embodiment, the present invention is not limited to this. FIG. 6 is a schematic cross sectional view showing the configuration of a power supply device 100 according to a first modified example. As shown in FIG. 6, a grounding member 40 may be embedded in a mold resin 30 between a power supply circuit 20 and a resin injector 2 of a casing 10. In this case, adhesion between the mold resin 30 and the grounding member 40 can be easily improved. The grounding member 40 may be a conductive plate or a conductive net.

Figure 7A:
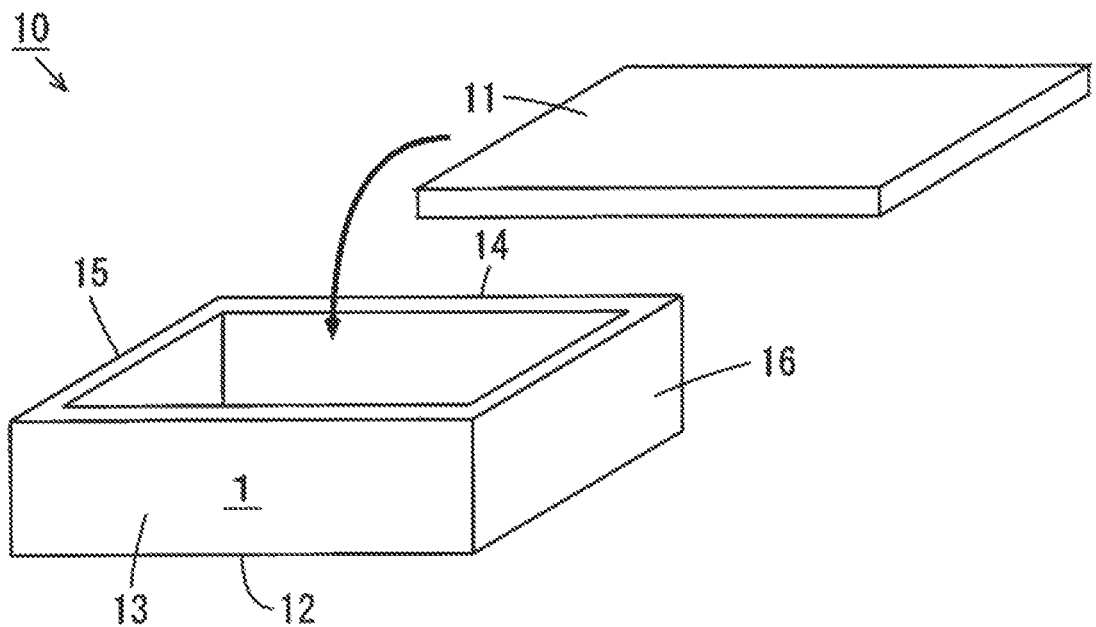
FIGS. 7A and 7B are perspective views showing a casing of a power supply device according to a second modified example.
Figure 7B:
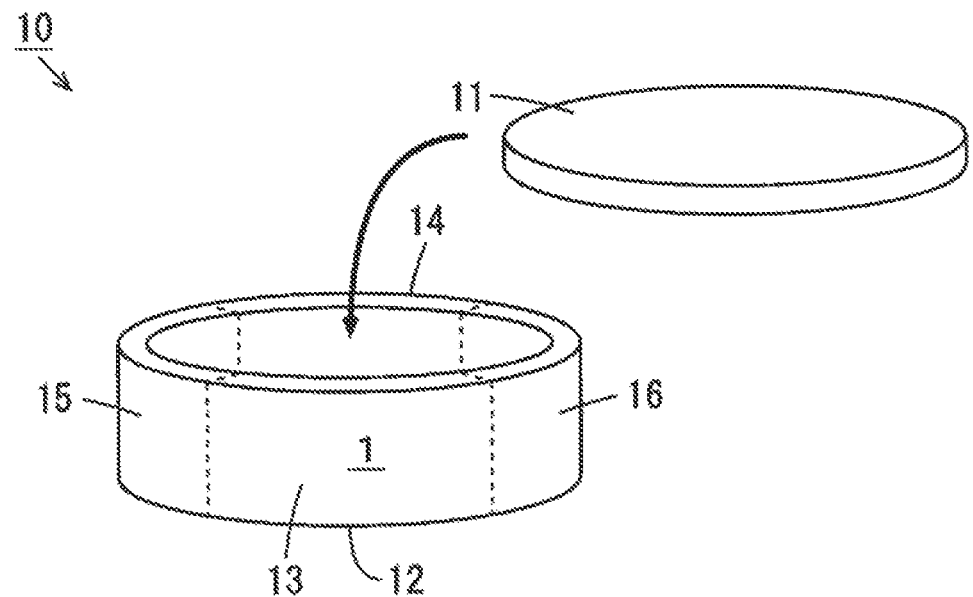

Further, in the above-mentioned embodiment, the casing 10 is vertically long, and the casing 10 is formed such that the dimension in an up-and-down direction is relatively large. However, the present invention is not limited to this. FIGS. 7A and 7B are perspective views showing a casing 10 of a power supply device 100 according to a second modified example. In the example of FIG. 7A, the distance between an upper surface portion 11 and a bottom surface portion 12 facing each other is shorter than the distance between side surface portions 13, 14 facing each other and shorter than the distance between side surface portions 15, 16 facing each other.

In the example of FIG. 7B, a casing 10 is cylindrical. Specifically, an upper surface portion 11 and a bottom surface portion 12 have a circular plate shape, and side surface portions 13 to 16 has a curved shape. In FIG. 7B, the boundaries between the side surface portions 13 to 16 are indicated by the dotted lines. Also in the example of FIG. 7B, the distance between the upper surface portion 11 and the bottom surface portion 12 facing each other is shorter than the distance between the side surface portions 13, 14 facing each other and shorter than the distance between the side surface portions 15, 16 facing each other.

With the above-mentioned configuration, in the second modified example, the casing 10 is formed such that the dimension in the up-and-down direction is relatively small. In this case, the circuit board 23 of FIG. 1 may be arranged such that its mounting surface is directed in the up-and-down direction.

Depending on the type of the mold resin 30 and the shape of the casing 10, in a case where the liquid precursor 31 (FIG. 4B) filling the casing 10 shrinks when being cured or a case where thermal expansion of the mold resin 30 and the casing 10 occurs, upward stress may concentrate in a bottom portion of the mold resin 30. Even in such a case, the stress is eased with the second modified example. Therefore, separation of the mold resin 30 from the bottom surface portion 12 of the casing 10 is easily prevented. Thus, generation of an air gap between the mold resin 30 and the bottom surface portion 12 is easily prevented. As a result, generation of very small discharge in the air gap can be more easily prevented.

(5) Effects

In the power supply device 100 according to the present embodiment, even in a case where the air gap A is generated between the upper surface portion 11 of the casing 10 and the mold resin 30, an air gap is not generated between the grounding member 40 and the power supply circuit 20. Therefore, a single insulator made of the mold resin 30 is formed, and a composite insulator is not formed, between the grounding member 40 and the power supply circuit 20. Thus, generation of very small discharge caused by a composite insulator is prevented. Thus, stability of operation of the power supply device 100 can be improved.

Further, in the mass spectrometer 200, a voltage is supplied to the flight tube 230 by the above-mentioned power supply device 100. Therefore, the flight time of each ion that passes through the flight space of the flight tube 230 can be detected with high accuracy. Thus, mass spectrometry can be performed with high accuracy.

While the mass spectrometer 200 is a MALDI-TOFMS that uses an ion source as MALDI, and the power supply device 100 is applied as a power supply device that supplies a voltage to the flight tube 230 of the MALDI-TOFMS in the present embodiment, the present invention is not limited to this. The power supply device according to one aspect of the present invention may be applied to another measurement device, an analysis device or the like, or may be applied to various mass spectrometers.

For example, the power supply device may supply a voltage to an electrode (a flight tube or a reflectron electrode) that forms an ion flight portion that performs mass separation in a mass spectrometer of Q-TOF type which is a combination of a quadrupole mass filter and TOF. Alternatively, the power supply device may supply a voltage to an electrode that forms an ion fly portion that performs mass separation in a Fourier Transform Mass Spectrometer (FTMS) represented by an Orbitrap.

(6) Reference Examples

Figure 8A:
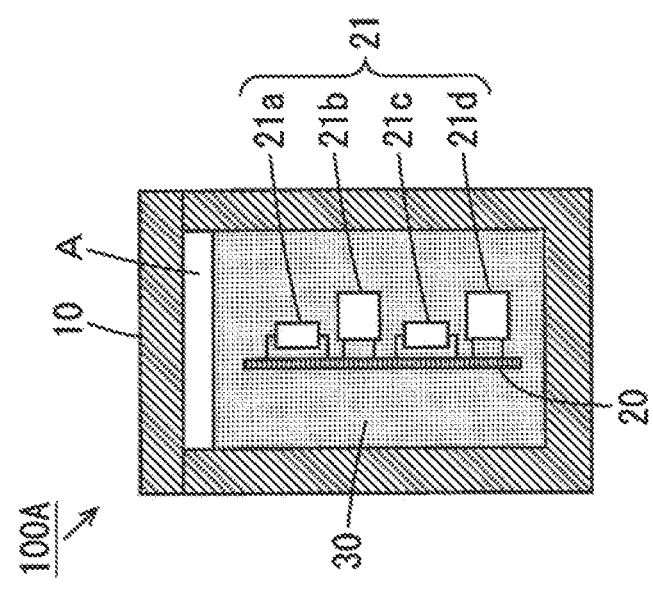
FIGS. 8A to 8C are schematic cross sectional views showing the configurations of power supply devices according to first to third reference examples.
Figure 8B:
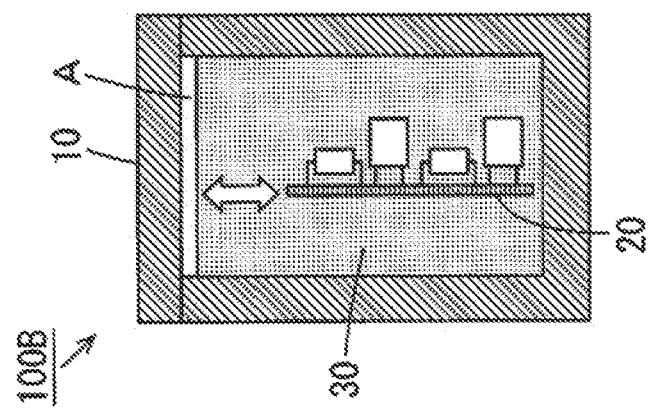
Figure 8C:
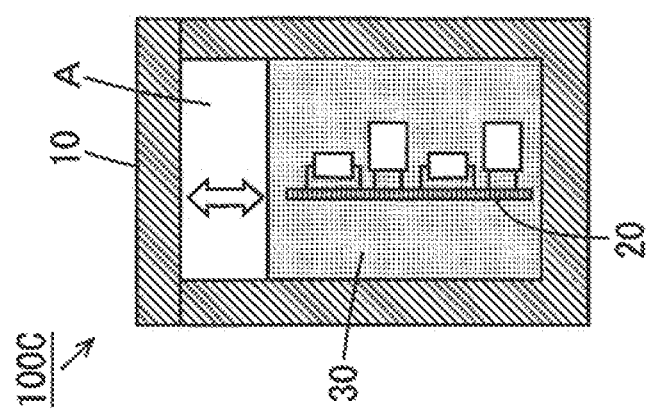

As reference examples, a power supply device that can improve stability of operation without using the grounding member 40 in the above-mentioned embodiment will be described. FIGS. 8A to 8C are schematic cross sectional views respectively showing the configurations of power supply devices according to first to third reference examples. In FIGS. 8A to 8C, a temperature detector 50, a temperature adjustor 60, a heat dissipation member 70 and a thermal insulating member 80 are not shown.

As shown in FIG. 8A, a voltage conversion circuit 21 includes circuit elements 21a, 21b, 21c, 21d for respectively generating voltages of 2.5 kV, 5 kV, 7.5 kV and 10 kV. The circuit elements 21a, 21b, 21c, 21d are mounted on a circuit board 23 to be arranged in this order. In a power supply device 100A according to the first reference example, a circuit board 23 is arranged such that the lower voltage a circuit element among the circuit elements 21a to 21d generates, the closer the circuit element is positioned to the air gap A. In this case, discharge generated in an air gap A is more sufficiently reduced. Thus, stability of operation of the power supply device 100A can be improved.

However, in the power supply device 100A, design of the circuit board 23 is restricted, and arrangement of the circuit board 23 is restricted. In contrast, in the power supply device 100 in the present embodiment, design of the circuit board 23 is not restricted, or arrangement of the circuit board 23 is not restricted either. Thus, in the present embodiment, flexibility of design of the circuit board 23 and flexibility of arrangement of the circuit board 23 can be improved.

As shown in FIG. 8B, in a power supply device 100B according to the second reference example, the thickness of a mold resin 30 between a power supply circuit 20 and an air gap A is largely formed. In this case, an electric field generated in the air gap A is eased. Therefore, discharge generated in the air gap A is more sufficiently reduced. Thus, stability of operation of the power supply device 100B can be improved. However, in the power supply device 100B, the thickness of the mold resin 30 is large, so that the size of the casing 10 is increased. Therefore, it is difficult to reduce the size of the power supply device 100B.

In particular, in the power supply device 100B, the size of the casing 10 is increased for improvement of stability of operation, and the configuration for adjusting the temperature of the casing 10 is provided. Therefore, the size and weight of the power supply device 100B are likely to be increased. Further, when the size of the casing 10 is increased, the configuration for adjusting the temperature of the casing 10 is also increased. Therefore, the size of the power supply device 100 is increased even more.

In contrast, in the power supply device 100 in the present embodiment, it is not necessary to increase the thickness of the mold resin 30, so that it is not necessary to increase the size of the casing 10. Further, the shape of the casing 10 is not restricted. Thus, the size of the power supply device 100 can be reduced easily. Further, the shape of the casing 10 can be designed freely.

As shown in FIG. 8C, in a power supply device 100C according to the third reference example, the thickness of an air gap A is largely formed. In this case, a sufficiently large insulating distance is ensured, and the power supply circuit 20 is less influenced by discharge. Thus, stability of operation of the power supply device 100C can be improved. However, the thickness of the air gap A is large in the power supply device 100C, so that the size of the casing 10 is increased. Thus, it is difficult to reduce the size of the power supply device 100C.

In particular, in the power supply device 100C, the size of the casing 10 is increased for improvement of stability of operation, and the configuration for adjusting the temperature of the casing 10 is provided, similarly to the power supply device 100B. Therefore, the size and weight of the power supply device 100C are likely to be increased. Further, when the size of the casing 10 is increased, the configuration for adjusting the temperature of the casing 10 is increased. Therefore, the size of the power supply device 100C is increased even more.

In contrast, it is not necessary to increase the thickness of the air gap A in the power supply device 100 in the present embodiment, so that it is not necessary to increase the size of the casing 10. Further, the shape of the casing 10 is not restricted. Thus, the size of the power supply device 100 can be reduced easily. Further, the shape of the casing 10 can be designed freely.

The invention claimed is:

1. A mass spectrometer comprising:
   an ionizer that ionizes a sample;
   a fly portion into which ions generated by the ionizer are introduced and in which the ions fly;
   an ion detector that detects the ions that have flown in the fly portion; and
   a power supply device in which the fly portion is constituted by at least one electrode and which supplies a voltage to the electrode, and
   the power supply device comprising:
   a power supply circuit;
   a conductive casing that has a resin injector and stores at least part of a circuit portion of the power supply circuit;
   a mold resin that fills the casing to enclose the circuit portion; and
   a conductive grounding member arranged in the casing to shield the resin injector from the circuit portion while being in contact with the mold resin.

2. The mass spectrometer according to claim 1, wherein the grounding member is provided to come into contact with an outer surface of the mold resin facing the resin injector of the casing.

3. The mass spectrometer according to claim 1, wherein the grounding member is embedded in the mold resin between the circuit portion and the resin injector of the casing.

4. The mass spectrometer according to claim 1, wherein the grounding member includes a same resin as the mold resin.

5. The mass spectrometer according to claim 4, wherein the mold resin includes a silicone resin, and
   the grounding member is formed of a conductive silicone resin.

6. The mass spectrometer according to claim 1, wherein the casing includes
   first and second main surfaces facing each other, and
   first, second, third and fourth side surfaces connecting the first and second main surfaces to each other,
   the first and second side surfaces face each other,
   the second and fourth side surfaces face each other,
   the first main surface is provided to come into contact with the resin injector, and
   a distance between the first main surface and the second main surface is shorter than a distance between the first side surface and the second side surface and is shorter than a distance between the third surface and the fourth surface.

7. The mass spectrometer according to claim 1, further comprising:
   a temperature detector that detects a temperature of the casing; and
   a temperature adjustor that adjusts the temperature of the casing based on the temperature detected by the temperature detector.

8. The mass spectrometer according to claim 7, further comprising a heat dissipation member that dissipates heat generated from the temperature adjustor.

9. The mass spectrometer according to claim 8, further comprising a thermal insulating member that is attached to an outer surface of the casing while the heat dissipation member is exposed.

10. The mass spectrometer according to claim 1, wherein the fly portion is a flight tube.

\* \* \* \* \*